US007084551B2

(12) United States Patent
Yoshimura et al.

(10) Patent No.: US 7,084,551 B2
(45) Date of Patent: Aug. 1, 2006

(54) PIEZOELECTRIC CONVERTER

(75) Inventors: Kenichi Yoshimura, Kokubu (JP); Makoto Higashibeppu, Kokubu (JP)

(73) Assignee: Kyocera Corporation, Kyoto (JP)

( * ) Notice: Subject to any disclaimer, the term of this patent is extended or adjusted under 35 U.S.C. 154(b) by 176 days.

(21) Appl. No.: 10/873,616

(22) Filed: Jun. 22, 2004

(65) Prior Publication Data

US 2005/0018020 A1 Jan. 27, 2005

(30) Foreign Application Priority Data

Jun. 24, 2003 (JP) ............................ 2003-180030

(51) Int. Cl.
*H01L 41/08* (2006.01)

(52) U.S. Cl. ....................... 310/324; 310/320; 310/328

(58) Field of Classification Search ................ 310/320, 310/324, 328

See application file for complete search history.

(56) References Cited

U.S. PATENT DOCUMENTS

| | | | | |
|---|---|---|---|---|
| 6,003,971 | A | 12/1999 | Hanks et al. | |
| 6,334,673 | B1 | 1/2002 | Kitahara et al. | |
| 6,340,224 | B1 * | 1/2002 | Hotomi et al. | 347/70 |
| 6,919,667 | B1 * | 7/2005 | Yamaguchi et al. | 310/324 |
| 2002/0140787 | A1 | 10/2002 | Takahashi | |
| 2004/0233257 | A1 * | 11/2004 | Satake et al. | 347/71 |
| 2005/0099092 | A1 * | 5/2005 | Nakamura et al. | 310/320 |
| 2005/0157093 | A1 * | 7/2005 | Murai | 347/69 |

FOREIGN PATENT DOCUMENTS

| | | |
|---|---|---|
| EP | 0 723 867 | 8/1996 |
| JP | 6-143560 | 5/1994 |
| JP | 11-034320 | 2/1999 |
| JP | 2001-10038 | 1/2001 |
| JP | 2003-165212 | 6/2003 |

* cited by examiner

*Primary Examiner*—Thomas M. Dougherty
(74) *Attorney, Agent, or Firm*—Hogan & Hartson L.L.P.

(57) ABSTRACT

A piezoelectric converter comprising a piezoelectric actuator that includes a piezoelectric ceramic layer of thin plate shape being stacked on the surface of a substrate on the side thereof whereon cavities to be filled with a liquid are formed wherein, in order to prevent a significant buckling deformation from occurring in a region of the piezoelectric actuator that corresponds to the cavities of the substrate, the thickness T (mm) of the piezoelectric ceramic layer and maximum width W (mm) of the cavities in the direction of substrate surface are set so as to satisfy the relation of expression (1).

$$T \geqq (19.6W + 5.5) \times 10^{-3} \quad (1)$$

4 Claims, 1 Drawing Sheet

PIEZOELECTRIC CONVERTER

TECHNICAL FIELD

The present invention relates to a piezoelectric converter for converting an electrical signal into a change in hydraulic pressure by making use of the electrostrictive effect of piezoelectric ceramics.

BACKGROUND OF THE INVENTION

The piezoelectric converter is used as a piezoelectric inkjet head for discharging ink droplets and carry out printing in an on-demand type inkjet printer.

The piezoelectric converter has such a structure, as described in Japanese Unexamined Patent Publication No. JP-H11-34320-A2 (1999), that a piezoelectric actuator 92 that includes an electrically conductive oscillator 921 of such a size that covers a plurality of cavities 911, a piezoelectric ceramic layer 922 of flat plate shape having such a size that covers the plurality of cavities 911, and a plurality of individual electrodes 923 which are separated in correspondence to the cavities 911 and having a size corresponding to each of the cavities 911, which are stacked on one side of a plate-shaped substrate 91 that has the plurality of cavities 911 to be filled with ink disposed in the direction of plane (refer to FIG. 3).

The electrically conductive oscillator 921, together with the individual electrodes 923, sandwiches the piezoelectric ceramic layer 922 so as to serve also as a common electrode for applying a drive voltage to the piezoelectric ceramic layer 922.

The substrate 91 usually has a form of plate made of a metal such as stainless steel. Each cavity 911 is connected via a nozzle passage 912 to a nozzle 913 that reaches the surface of the substrate 91 opposite to the side where the piezoelectric actuator 92 is stacked, for discharging ink droplets. Each cavity 911 is also connected via a feed port to a common feed passage that supplies the ink from an ink tank of the inkjet printer (not shown).

When a drive voltage is applied between the oscillator plate 921 serving as the common electrode and at least one of the plurality of individual electrodes 923, while the cavities 911 are filled with ink, a region of the piezoelectric ceramic layer 922 where the drive voltage is applied contracts in the direction of plane. Since the piezoelectric ceramic layer 922 is fastened onto the oscillator plate 921, the region of the piezoelectric actuator 92 where the drive voltage is applied deflects so as to protrude toward the cavity 911 in accordance to the contraction. This deflection compresses the ink in the cavity 911, so that an ink droplet is discharged through the nozzle 913 for printing.

The piezoelectric converter shown in FIG. 3 is manufactured by placing the substrate 91 having a plurality of recesses that would become the cavities 911 formed on one side thereof and the piezoelectric actuator 92 having the laminated structure as described above one on another via a thermosetting adhesive layer (not shown), and heating the stack while applying a pressure in a direction perpendicular to the surface so as to harden the adhesive and hold the stack together.

In the piezoelectric converter of the prior art, however, when cooled down to the room temperature after bonding, significant buckling deformation (deflection) tends to occur in a free region of the piezoelectric actuator 92 which corresponds to the cavity 911 and is not fastened onto the substrate 91, namely a region that deflects so as to protrude toward the cavity 911 when the drive voltage is applied thereto. This buckling deformation impedes the region from deflecting when the drive voltage is applied thereto, and there was such a problem that the ink droplet cannot be properly discharged through the nozzle 913.

The problem described above is caused by thermal stress due to the difference in thermal expansion coefficient between the metal that makes the substrate 91 and the piezoelectric ceramic material that makes the piezoelectric ceramic layer 922.

Since metals have generally higher thermal expansion coefficients than ceramics, when the adhesive is heated so as to bond the substrate 91 and the piezoelectric actuator 92 together through thermosetting of the adhesive, the substrate 91 made of a metal undergoes larger thermal expansion in the direction of plane than the piezoelectric actuator 92 that includes the piezoelectric ceramic layer 922, in the early stage of heating when the adhesive has not yet hardened.

As the adhesive hardens and both members are fastened together in this state, the substrate 91 is subjected to larger contraction in the direction of plane than the piezoelectric actuator 92 in the cooling process, resulting in the stress concentration in the direction of plane in the region of the piezoelectric actuator 92 that corresponds to the cavity 911, which causes a significant buckling deformation in the region.

SUMMARY OF THE INVENTION

An object of the present invention is to provide a piezoelectric converter that can improve the ink droplet discharging characteristic, when used as a piezoelectric inkjet head, over that of the prior art, because significant buckling deformation does not occur in a region of the piezoelectric actuator that corresponds to the cavity.

In order to achieve the object described above, the inventor of the present application reviewed the structure of the piezoelectric converter, and obtained the following finding.

Buckling deformation that occurs in the piezoelectric actuator during thermal setting of the adhesive becomes more conspicuous when thickness of the piezoelectric ceramic layer is smaller in comparison to the width of the cavities in the direction of substrate surface and, in this regard, the piezoelectric ceramic layer in the piezoelectric converter of the prior art described in Japanese Unexamined Patent Publication JP-H11-34320-A2 is too thin.

The inventor then closely investigated the relation between thickness T (mm) of the piezoelectric ceramic layer, maximum width W (mm) of the cavities in the direction of substrate surface and the amount of buckling deformation of the piezoelectric actuator, and obtained the following finding. Assume that the thickness T and the maximum width W satisfy the relation of expression (1):

$$T \geqq (19.6W + 5.5) \times 10^{-3} \qquad (1)$$

then it is made possible to either completely eliminate the buckling deformation of the piezoelectric actuator in a region thereof corresponding to the cavity, or reduce the amount of buckling deformation to a level that is negligible in practical applications, and therefore a piezoelectric inkjet head having better ink droplet discharging characteristic than that of the prior art can be made.

Thus the piezoelectric converter of the present invention comprises a plate-shaped substrate with cavities to be filled with a liquid are formed on one side of the substrate and a piezoelectric actuator that includes a piezoelectric ceramic layer of thin plate shape being stacked on the surface of the substrate where the cavities are formed, wherein thickness T (mm) of the piezoelectric ceramic layer and maximum width W (mm) of the cavities in the direction of substrate surface satisfy the relation of expression (1).

$$T \geqq (19.6\,W + 5.5) \times 10^{-3} \quad (1)$$

In the piezoelectric converter of the present invention, although there is no upper limit specified for thickness T of the piezoelectric ceramic layer, thickness T more than $100 \times 10^{-3}$ mm may lead to insufficient deflection under a drive voltage applied thereto even when buckling deformation does not occur, resulting in poor ink droplet discharging characteristic when used as a piezoelectric inkjet head. When thickness T is $100 \times 10^{-3}$ mm or less, on the other hand, sufficient deflection can be achieved under a drive voltage applied thereto and ink droplet discharging characteristic can be improved further. Therefore, the thickness T of the piezoelectric ceramic layer is preferably $100 \times 10^{-3}$ mm or less.

In order to more surely suppress or prevent buckling deformation of the piezoelectric actuator, the thickness T of the piezoelectric ceramic layer is preferably larger than $30 \times 10^{-3}$ mm.

In order to set the thickness of the piezoelectric ceramic layer to $100 \times 10^{-3}$ mm or less, maximum width W of the cavities in the direction of substrate surface is preferably 5 mm or less.

DESCRIPTION OF THE PREFERRED EMBODIMENTS

Figure 1:
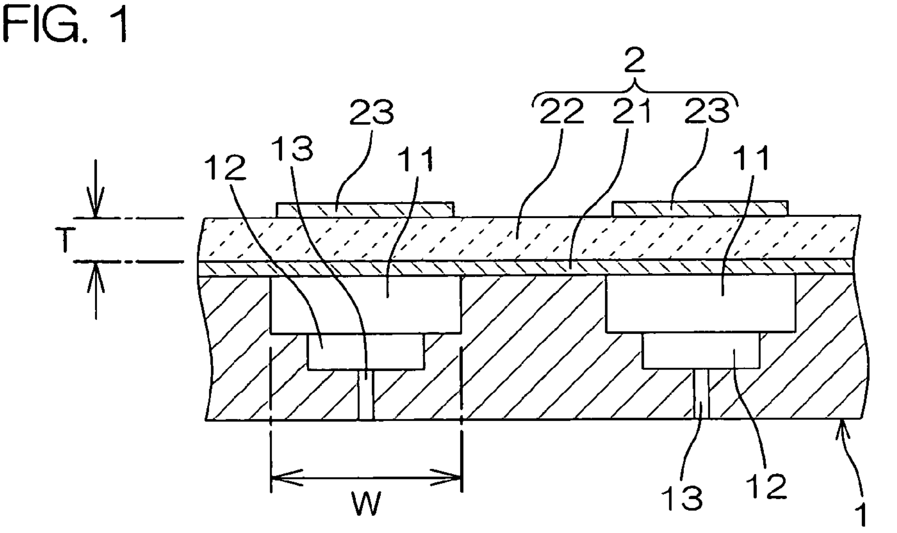
FIG. 1 is a sectional view showing an example of the embodiment of the piezoelectric converter of the present invention that can be preferably applied as a piezoelectric inkjet head.

FIG. 1 is a sectional view showing an example of embodiment of piezoelectric converter of the present invention that can be preferably applied as a piezoelectric inkjet head.

The piezoelectric converter of the example shown in the figure has such a constitution as a piezoelectric actuator 2 that includes an electrically conductive oscillator plate 21 of such a size that covers a plurality of cavities 11, a piezoelectric ceramic layer 22 of flat plate shape having such a size that covers the plurality of cavities 11, and a plurality of individual electrodes 23 which are separated in correspondence to the cavities 11 and having a size corresponding to each of the cavities 11 are stacked on one side of a plate-shaped substrate 1 that has the plurality of cavities 11 to be filled with a liquid disposed in the direction of plane.

The electrically conductive oscillator plate 21, together with the individual electrodes 23, sandwiches the piezoelectric ceramic layer 22 so as to serve also as a common electrode for applying a drive voltage to the piezoelectric ceramic layer 22.

Each cavity 11 is connected via a nozzle passage 12 to a nozzle 13 that reaches the surface of the substrate 1 opposite to the side where the piezoelectric actuator 2 is stacked, for discharging ink droplets. Each cavity 11 is also connected via a feed port to a common feed passage that supplies the ink from an ink tank of the inkjet printer (not shown).

When a drive voltage is applied across the oscillator plate 21 that serves as the common electrode and at least one of the plurality of individual electrodes 23 while the cavities 11 are filled with ink, a region of the piezoelectric ceramic layer 22 where the drive voltage is applied contracts in the direction of plane. Since the piezoelectric ceramic layer 22 is fastened onto the oscillator plate 21, the region of the piezoelectric actuator 2 where the drive voltage is applied deflects so as to protrude toward the cavity 11 in accordance to the contraction described above. This deflection compresses the ink in the cavity 11, so that an ink droplet is discharged through the nozzle 13 for printing.

Among the members described above, the substrate 1 is usually formed of a plate made of metal such as stainless steel.

Specifically, the substrate 1 shown in the figure is formed by integrating a first plate member having thickness that corresponds to the depth of the cavity 11 and through holes to make the cavities 11 formed therein by etching by using photolithography or the like, a second plate member having thickness that corresponds to the length of the nozzle passage 12 and through holes to make the nozzle passage 12 formed therein similarly to the above, and a third plate member having thickness that corresponds to the length of the nozzle 13 and through holes to make the nozzle 13 formed therein similarly to the above.

Of the piezoelectric actuator 2, the oscillator plate 21 is formed in plate shape having a predetermined thickness from, for example, a single-element metal such as molybdenum, tungsten, tantalum, titanium, platinum, iron or nickel, an alloy of such metals or other metallic material such as stainless steel.

The piezoelectric ceramic layer 22 is formed by firing a green sheet of piezoelectric material or polishing a sintered piezoelectric material into a thin plate.

The piezoelectric ceramic material used in forming the piezoelectric ceramic layer 22 may be lead zirconate titanate (PZT), or PZT-based piezoelectric material made by adding one or more oxide of a metal such as lanthanum, barium, niobium, zinc, nickel or manganese to PZT, such as PLZT. Lead magnesium niobate (PMN), lead nickel niobate (PNN), lead zinc niobate, lead manganese niobate, lead antimony stannate, lead titanate or barium titanate may be included as a major component. The green sheet of piezoelectric material includes a compound that would make some of the piezoelectric material described above when fired.

The oscillator plate 21 and the piezoelectric ceramic layer 22 can be bonded together by means of an adhesive.

The individual electrodes 23 may be formed by various processes such as follows.

(a) An electrically conductive paste that includes powder of a metal that has high electrical conductivity such as gold, silver, platinum, copper or aluminum is applied to the surface of the piezoelectric ceramic layer 22 by printing in a predetermined pattern using screen printing process or the like.

(b) A thin metal plate similar to the oscillator plate 21 is bonded onto the surface of the piezoelectric ceramic layer 22 by means of, for example, an adhesive and is then formed into a predetermined shape by etching with photolithography or the like.

(c) A plating resist layer having openings of predetermined shape is formed on the surface of the piezoelectric ceramic layer 22 by photolithography or the like, the surface is then plated and the resist layer is removed, and the surface is formed into a predetermined shape.

The piezoelectric converter shown in the figure is manufactured by placing the piezoelectric actuator 2 having the laminated structure described above on the substrate 1, that has a plurality of recesses that would become the cavities 11 formed on one side thereof, via a thermosetting adhesive layer (not shown), and heating the stack while applying a pressure so as to harden the adhesive and hold the stack together.

The thermosetting adhesive used to bond the substrate 1 and the piezoelectric actuator 2 may be one of various known adhesives such as those based on epoxy or polyimide. When consideration is given to the durability against heat applied during bonding, a thermosetting adhesive similar to those described above is preferably used also for bonding the piezoelectric ceramic layer 22 and the thin metal plates used to make the oscillator plate 21 and the individual electrodes 23.

In the piezoelectric converter of the present invention, thickness T (mm) of the piezoelectric ceramic layer 22 and maximum width W (mm) of the cavities 11 in the direction of substrate surface must satisfy the relation of expression (1) as mentioned previously.

$$T \geqq (19.6\,W+5.5)\times10^{-3} \quad (1)$$

For this purpose, maximum width W may be determined while giving consideration to the thickness T of the piezoelectric ceramic layer 22 that is to be combined when designing the planar configuration of the cavities 11, or thickness T of the piezoelectric ceramic layer 22 to be combined is determined according to the maximum width W that is determined from the planar configuration of the cavities 11, or both of these steps may be taken at the same time.

The thickness T of the piezoelectric ceramic layer 22 is preferably $100\times10^{-3}$ mm or less, as mentioned previously. Thickness T is more preferably larger than $30\times10^{-3}$ mm. In order to more surely suppress or prevent buckling deformation of the piezoelectric actuator, thickness T of the piezoelectric ceramic layer is preferably $35\times10^{-3}$ mm or larger, and more preferably $40\times10^{-3}$ mm or larger, in the range described above.

Although there is no limitation to the maximum width W, in order to set the thickness of the piezoelectric ceramic layer 22 to $100\times10^{-3}$ mm or less, it is preferably 5 mm or less.

Figure 2:
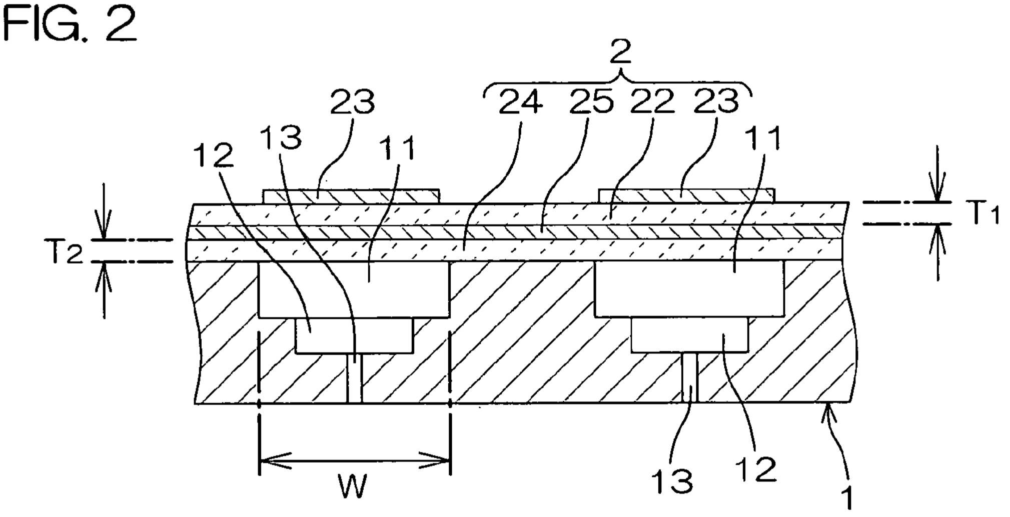
FIG. 2 is a sectional view showing a variation of the piezoelectric converter.
Figure 3:
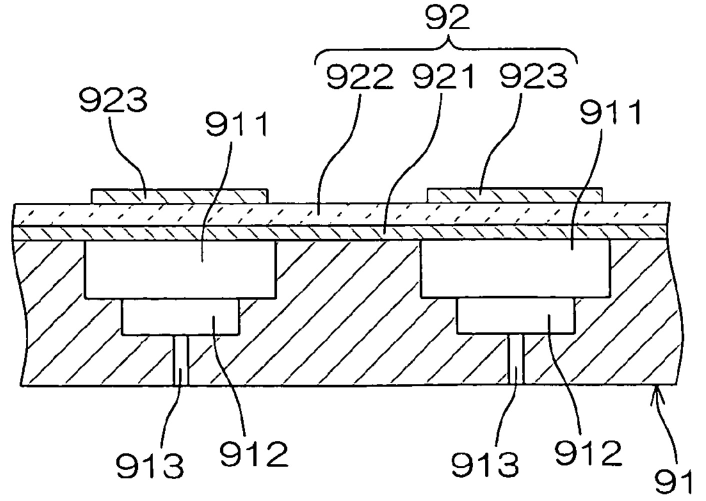
FIG. 3 is a sectional view showing an example of the piezoelectric converter of the prior art.

The piezoelectric actuator 2 can be formed, for example, in a laminate comprising the oscillator plate 24 made of a piezoelectric ceramic material formed from a green sheet of piezoelectric material similar to the piezoelectric ceramic layer 22, the common electrode 25 made of a thin metal film, the piezoelectric ceramic layer 22 and the individual electrodes 23, as shown in FIG. 2.

In this case, thickness T (mm) of the piezoelectric ceramic layer, which is the total thickness $T_1+T_2$ of thickness $T_1$ of the piezoelectric ceramic layer 22 and thickness $T_2$ of the oscillator plate 24, and maximum width W (mm) of the cavities 11 in the direction of substrate surface must be set in ranges that satisfy the relation of expression (1) mentioned previously.

This is because the oscillator plate 24 made of piezoelectric ceramic material functions as a reinforcing member of the piezoelectric actuator 2 together with the piezoelectric ceramic layer 22, and is involved in the occurrence of the buckling deformation mentioned previously and prevention thereof.

Since the substrate 1 is the same as that shown in FIG. 1, identical numerals are assigned to the same portions and description will be omitted.

EXAMPLE

Fabrication of Models of Piezoelectric Converter

Laminates of piezoelectric ceramic layers having thickness T (mm) shown in Table 1 made of PZT (thermal expansion coefficient 5 ppm/K) and oscillator plates made of metal having thickness of $15\times10^{-3}$ mm were fabricated as models of the piezoelectric actuator.

Plates made of stainless steel (thermal expansion coefficient 18 ppm/K) having through holes formed to make cavities by etching were prepared as the models of the substrate. Maximum width W (mm) of the cavities in the direction of substrate surface were set to those shown in Table 1.

The laminate and the plate were placed one on another via an epoxy-based adhesive layer, with the oscillator plate facing the plate. The laminate was then heated while applying a pressure in the direction perpendicular to the surface in a thermostat kept at 150° C. for 30 minutes so as to harden the adhesive, and was taken out of the thermostat and was cooled for 60 minutes so as to lower the temperature to 23° C.

Displacement amount of the center of a region of the substrate that corresponds to the cavity relative to the surrounding portion was measured in the model of the piezoelectric actuator, as the amount of buckling deformation of the piezoelectric actuator, by using a laser Doppler vibration meter, and evaluated as buckled (Bad) when the absolute value of displacement exceeded $10\times10^{-3}$ mm and no buckling (Good) when the absolute value of displacement was $10\times10^{-3}$ mm or less.

The results of measurements are shown in Table 1.

TABLE 1

| | Maximum width W | | | |
|---|---|---|---|---|
| Thickness T | 1 mm | 2 mm | 3 mm | 4 mm |
| $40\times10^{-3}$ mm | Good | Bad | Bad | Bad |
| $50\times10^{-3}$ mm | Good | Good | Bad | Bad |
| $60\times10^{-3}$ mm | Good | Good | Bad | Bad |
| $70\times10^{-3}$ mm | Good | Good | Good | Bad |
| $80\times10^{-3}$ mm | Good | Good | Good | Bad |

From the results of measurements shown in Table 1, it was verified that the piezoelectric actuator can be prevented from undergoing significant buckling deformation when thickness T (mm) and maximum width W (mm) satisfy the relation of expression (1).

$$T \geqq (19.6\,W+5.5)\times10^{-3} \quad (1)$$

The present application is in correspondence to Patent Application No.2003-180030 filed with Japanese Patent Office on Jun. 24, 2003, and the whole disclosure thereof is incorporated herein by reference.

The invention claimed is:

1. A piezoelectric converter comprising a plate-shaped substrate, said substrate having cavities to be filled with a liquid formed on one side thereof, with a piezoelectric actuator that includes a piezoelectric ceramic layer of thin plate shape being stacked on the surface of said substrate whereon the cavities are formed, wherein the thickness T (mm) of said piezoelectric ceramic layer and maximum width W (mm) of said cavities in the direction of substrate surface satisfy the relation of expression (1)

$$T \geqq (19.6\,W + 5.5) \times 10^{-3} \quad (1).$$

2. The piezoelectric converter according to claim 1, wherein the thickness T of said piezoelectric ceramic layer is $100 \times 10^{-3}$ mm or less.

3. The piezoelectric converter according to claim 1 or 2, wherein the thickness T of said piezoelectric ceramic layer is more than $30 \times 10^{-3}$ mm.

4. The piezoelectric converter according to claim 1, wherein maximum width W of said cavities in the direction of substrate surface is 5 mm or less.

* * * * *